United States Patent
Lee et al.

(10) Patent No.: US 9,202,984 B2
(45) Date of Patent: *Dec. 1, 2015

(54) LIGHT-EMITTING DIODE AND METHOD OF FABRICATING THE SAME

(71) Applicant: SEOUL VIOSYS CO., LTD., Ansan-si (KR)

(72) Inventors: Jin Woong Lee, Ansan-si (KR); Kyoung Wan Kim, Ansan-si (KR); Yeo Jin Yoon, Ansan-si (KR); Ye Seul Kim, Ansan-si (KR); Tae Kyoon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/721,224

(22) Filed: May 26, 2015

(65) Prior Publication Data
US 2015/0255679 A1    Sep. 10, 2015

Related U.S. Application Data

(63) Continuation of application No. 14/098,687, filed on Dec. 6, 2013, now Pat. No. 9,041,038.

(30) Foreign Application Priority Data

Dec. 12, 2012   (KR) .................. 10-2012-0144514

(51) Int. Cl.
*H01L 33/00* (2010.01)
*H01L 33/38* (2010.01)
(Continued)

(52) U.S. Cl.
CPC .............. *H01L 33/382* (2013.01); *H01L 24/05* (2013.01); *H01L 33/005* (2013.01); *H01L 33/20* (2013.01); *H01L 33/387* (2013.01); *H01L 33/42* (2013.01); *H01L 33/46* (2013.01); *H01L 33/60* (2013.01); *H01L 33/62* (2013.01); *H01L 33/007* (2013.01); *H01L 33/0075* (2013.01); *H01L 33/38* (2013.01); *H01L 2224/04042* (2013.01); *H01L 2224/05558* (2013.01); *H01L 2224/05644* (2013.01);
(Continued)

(58) Field of Classification Search
CPC ......... H01L 33/20; H01L 33/42; H01L 33/60; H01L 33/62; H01L 33/46; H01L 33/382; H01L 33/387
USPC ................................... 257/98, 99; 438/29, 42
See application file for complete search history.

(56) References Cited

U.S. PATENT DOCUMENTS 9,041,038 B2 *   5/2015   Lee et al. .................. 257/98
2011/0140160 A1 *   6/2011   Kim et al. .................. 257/99
(Continued)

OTHER PUBLICATIONS

Office Action issued Oct. 7, 2014, in U.S. Appl. No. 14/098,687.
(Continued)

*Primary Examiner* — Trung Q Dang
(74) *Attorney, Agent, or Firm* — H.C. Park & Associates, PLC

(57) ABSTRACT

A light-emitting diode (LED) including a semiconductor stack structure including a first semiconductor layer, an active layer, and a second semiconductor layer, the semiconductor stack disposed on a substrate, a conductive substrate disposed on the semiconductor stack structure, and an electrode disposed on the conductive substrate and in ohmic contact with the conductive substrate, wherein the electrode comprises grooves penetrating the electrode and a portion of the conductive substrate.

30 Claims, 10 Drawing Sheets

(51) Int. Cl.
*H01L 33/20* (2010.01)
*H01L 33/46* (2010.01)
*H01L 23/00* (2006.01)
*H01L 33/42* (2010.01)
*H01L 33/60* (2010.01)
*H01L 33/62* (2010.01)

(52) U.S. Cl.
CPC .............. *H01L2924/12032* (2013.01); *H01L 2924/12041* (2013.01); *H01L 2933/0016* (2013.01); *H01L 2933/0025* (2013.01); *H01L 2933/0033* (2013.01); *H01L 2933/0058* (2013.01); *H01L 2933/0066* (2013.01)

(56) References Cited

U.S. PATENT DOCUMENTS

2012/0104359 A1   5/2012   Felker et al.
2013/0026519 A1*  1/2013   Huang et al. .................... 257/98

OTHER PUBLICATIONS

Notice of Allowance issued Jan. 27, 2015, in U.S. Appl. No. 14/098,687.

* cited by examiner

LIGHT-EMITTING DIODE AND METHOD OF FABRICATING THE SAME

CROSS-REFERENCE TO RELATED APPLICATIONS

This application is a continuation of U.S. patent application Ser. No. 14/098,687, filed on Dec. 6, 2013, and claims priority from and the benefit of Korean Patent Application No. 10-2012-0144514, filed on Dec. 12, 2012, each of which is incorporated herein by reference for all purposes as if fully set forth herein.

BACKGROUND

1. Field

Exemplary embodiments of the present invention relate to a Light-Emitting Diode (LED); and, particularly, to an LED having an ohmic electrode and a method of fabricating the same.

2. Discussion of the Background

In general, III-group element nitrides, such as gallium nitride (GaN) and aluminum nitride (AlN), have been considered as materials for LEDs for blue and ultraviolet light-emission areas because they may have excellent thermal stability and a direct transition-type energy band structure.

In particular, blue and green LEDs using GaN may be used in various fields, such as natural color flat display devices, traffic lights, indoor illumination, high-density light sources, high-resolution output systems, and optical communication.

The nitride semiconductor layer of such a III-group element, in particular, GaN, may be grown on a heterogeneous substrate having a similar crystal structure using a process, such as a Metal Organic Chemical Vapor Deposition (MOCVD) method or a Molecular Beam Epitaxy (MBE) method, because it may be difficult to fabricate a homogeneous substrate on which GaN can be grown.

A sapphire substrate having a hexagonal system structure is chiefly used as the heterogeneous substrate. However, an LED structure may be limited because sapphire is not electrically conductive, and processing, such as cutting and shaping, may be difficult because sapphire is very stable mechanically and chemically, and sapphire has very low thermal conductivity.

Accordingly, research has been carried out on a technique for fabricating an LED having a vertical type structure by growing nitride semiconductor layers on a heterogeneous substrate, such as a sapphire substrate, and then detaching the heterogeneous substrate.

FIG. 1 is a cross-sectional view of a conventional vertical-type LED.

Referring to FIG. 1, a conventional vertical-type LED 1000 includes a conductive substrate 1100. Compound semiconductor layers, including a P-type layer 1500, an active layer 1600, and an N-type layer 1700, are formed on the substrate 1100.

Furthermore, a P-type electrode 1400 and an adhesive layer 1200 are interposed between the compound semiconductor layers and the conductive substrate 1100.

In general, the compound semiconductor layers are grown on a sacrificial substrate (not shown), such as a sapphire substrate, using an MOCVD method.

Next, the P-type electrode 1400 and the adhesive layer 1200 are formed on the compound semiconductor layers, and a metal reflection layer 1300 may be formed between the P-type electrode 1400 and the adhesive layer 1200. Furthermore, the substrate 1100 is attached to the adhesive layer 1200.

Next, the sacrificial substrate is separated from the compound semiconductor layers using a laser lift-off technique, and thus the N-type layer 1700 may be exposed. Next, an electrode pad 1800 is formed on the exposed N-type layer 1700. Since the substrate 1100 having excellent heat dissipation performance may be adopted as described above, LED light-emitting efficiency can be improved and the vertical-type LED of FIG. 1 may be provided.

Such a vertical-type LED may adopt the P-type electrode 1400 that is subject to ohmic contact in order to reduce contact resistance between the compound semiconductor layers and the metal reflection layer 1300.

The N-type electrode 1800 is formed on the N-type layer 1700. The N-type electrode 1800 may be made of Al—Ti-based materials. When forming the N-type electrode 1800, the Al—Ti-based materials may require a high annealing temperature of 600° C. or greater. When annealing the N-type electrode 1800, thermal damage may occur in other previously formed layers. High-temperature annealing of 600° C. or greater may cause problems during the process, such as a reduction of reflectance in materials that form the P-type electrode 1400 and the deterioration of an ohmic characteristic. In particular, the Al—Ti-based materials may not form ohmic contact on the N-polar surface of a free-standing GaN substrate.

Furthermore, contact resistance may be high at a portion where the N-type layer 1700 contacts the N-type electrode 1800 because the N-type layer 1700 has a higher energy bandgap than the N-type electrode 1800, thereby raising a device operating voltage. The amount of heat dissipated may be increased owing to the high operating voltage.

Meanwhile, a process of forming an N-type electrode on a GaN substrate without using a conventional sacrificial substrate may be used. The GaN substrate may serve as a conductive substrate if Si is doped into the GaN substrate.

Particularly, an ohmic contact for the N-type electrode 1800 may be formed by depositing Ti/Al or Al/Ti on the GaN substrate and annealing the Ti/Al or Al/Ti at high temperature of 600° C. or higher. Furthermore, a semiconductor layer may be formed on a surface of the GaN substrate corresponding to a surface of the GaN substrate on which the N-type electrode has been formed. Accordingly, the process may be complicated and difficult to manufacture because a film formation process is performed after an electrode formation process.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide an LED that prevents thermal damage and has a low operating voltage by forming an electrode subject to ohmic contact.

An exemplary embodiment of the present invention also provides a method of fabricating an LED, which does not experience thermal damage and facilitates the fabrication process although an ohmic contact process that is performed after a film formation process.

Additional features of the invention will be set forth in the description which follows, and in part will be apparent from the description, or may be learned by practice of the invention.

An exemplary embodiment of the present invention discloses a light-emitting diode (LED) including a semiconductor stack structure including a first semiconductor layer, an active layer, and a second semiconductor layer, the semiconductor stack structure being disposed on a substrate, a conductive substrate disposed on the semiconductor stack structure, and an electrode disposed on and in ohmic contact with the conductive substrate, wherein the electrode includes grooves penetrating the electrode and a portion of the conductive substrate.

The electrode includes an electrode pad and extension pads extended from the electrode pad.

The grooves may be formed in the electrode pad and the extension pads.

The grooves may be formed in the extension pads.

The grooves may include a plurality of parallel groove shapes formed in the electrode pad.

The grooves may be formed in the electrode pad in a ring form.

The grooves may be formed in the electrode pad in a dot form arranged at regular intervals.

The grooves may be formed in the extension pad in a discontinuous dotted line form.

The grooves may be formed in the extension pads in a plurality of circles.

The LED may further include a plating layer disposed on the electrode pad and disposed in the grooves.

The conductive substrate may include a nitride doped with impurities.

The grooves may each have a cross section having a V-cut shape.

The LED may further include a reflection layer interposed between the electrode pad and the conductive substrate and configured to include a plurality of layers having different refractive indices. The reflection layer may be in a ring pattern, a surface of the reflection layer may include a rough portion, and the electrode pad may be connected to the conductive substrate via the reflection layer.

The LED may further include a reflection layer interposed between the electrode pad and the second semiconductor layer, the reflection layer including a plurality of layers having different refractive indices and a transparent electrode layer disposed on the second semiconductor layer. The transparent electrode layer may be disposed on the reflection layer and disposed between the electrode pad and the second semiconductor layer.

The electrode pad may include an N type electrode pad or a P type electrode pad.

An exemplary embodiment of the present invention also discloses a method of fabricating an LED including forming a semiconductor stack structure by sequentially forming a first semiconductor layer, an active layer, and a second semiconductor layer on a conductive substrate, forming an electrode on the semiconductor stack structure, performing laser scribing on the electrode to form grooves penetrating the electrode to a portion of the conductive substrate, and forming a plating layer on the electrode and in the grooves.

The electrode may include an electrode pad and extension pads extending from the electrode pad.

The laser scribing may transfer heat for ohmic contact between the electrode and the conductive substrate.

The method may further include attaching the conductive substrate to the electrode pad before forming the grooves.

The method may further include forming a reflection layer on the conductive substrate, before forming the plating layer on the electrode.

The grooves may be formed in the electrode pad and the extension pads.

The grooves may be formed in the extension pads.

The grooves may include a plurality of parallel groove shapes formed in the electrode pad.

The grooves may be formed in the electrode pad in a ring form.

The grooves may be formed in the electrode pad in a dot form arranged at regular intervals.

The grooves may be formed in the extension pad in a discontinuous dotted line form.

The grooves may be formed in the extension pad in a plurality of circles.

The electrode pad may include an N type electrode pad or a P type electrode pad.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Figure 1:
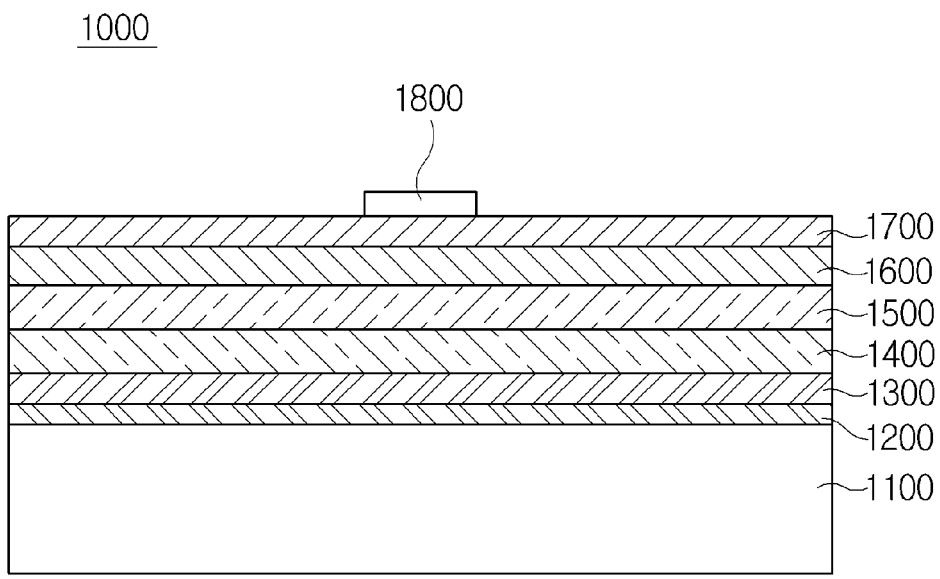
FIG. 1 is a cross-sectional view of a conventional LED.

Exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the exemplary embodiments. When a first layer is referred to as being "on" a second layer or "on" a substrate, it not only refers to a case where the first layer is formed directly on the second layer or the substrate but also a case where a third layer exists between the first layer and the second layer or the substrate. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Vertical-type LEDs in accordance with exemplary embodiments of the present invention are described with reference to FIGS. 2a, 2b, 3, 4a, 4b, 5a, 5b, 6a, 6b, 7a, 7b, 8, 9, and 10. In the exemplary embodiments of the present invention, vertical-type LEDs including GaN-based semiconductors are described. The LED according to the exemplary embodiments of the present invention may be applied to a horizontal LED having a mesa structure in addition to a vertical-type LED.

Figure 2A:
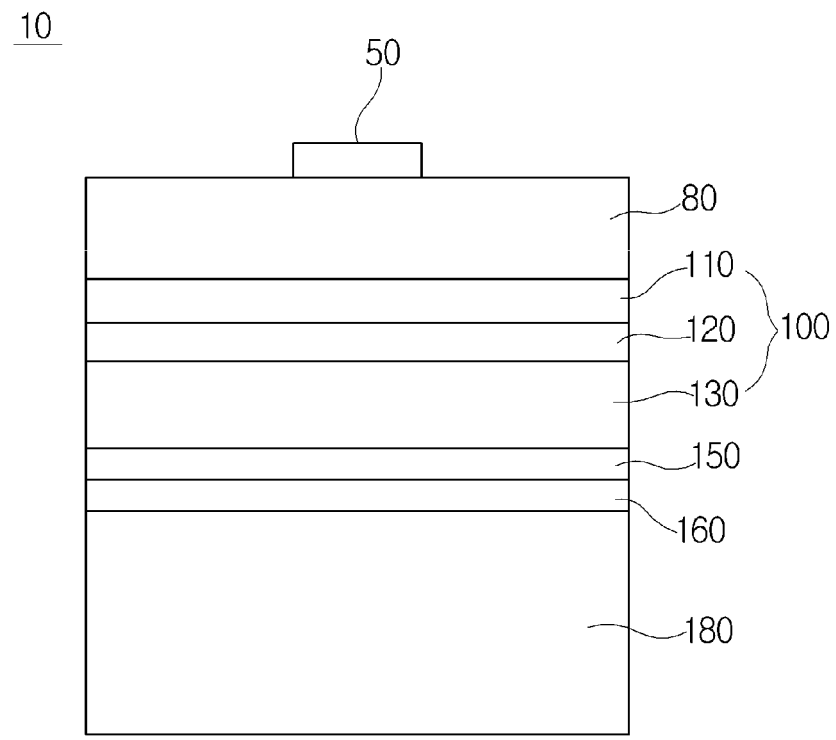
FIGS. 2a and 2b are cross-sectional views of a vertical-type LED in accordance with an exemplary embodiment of the present invention.
Figure 2B:
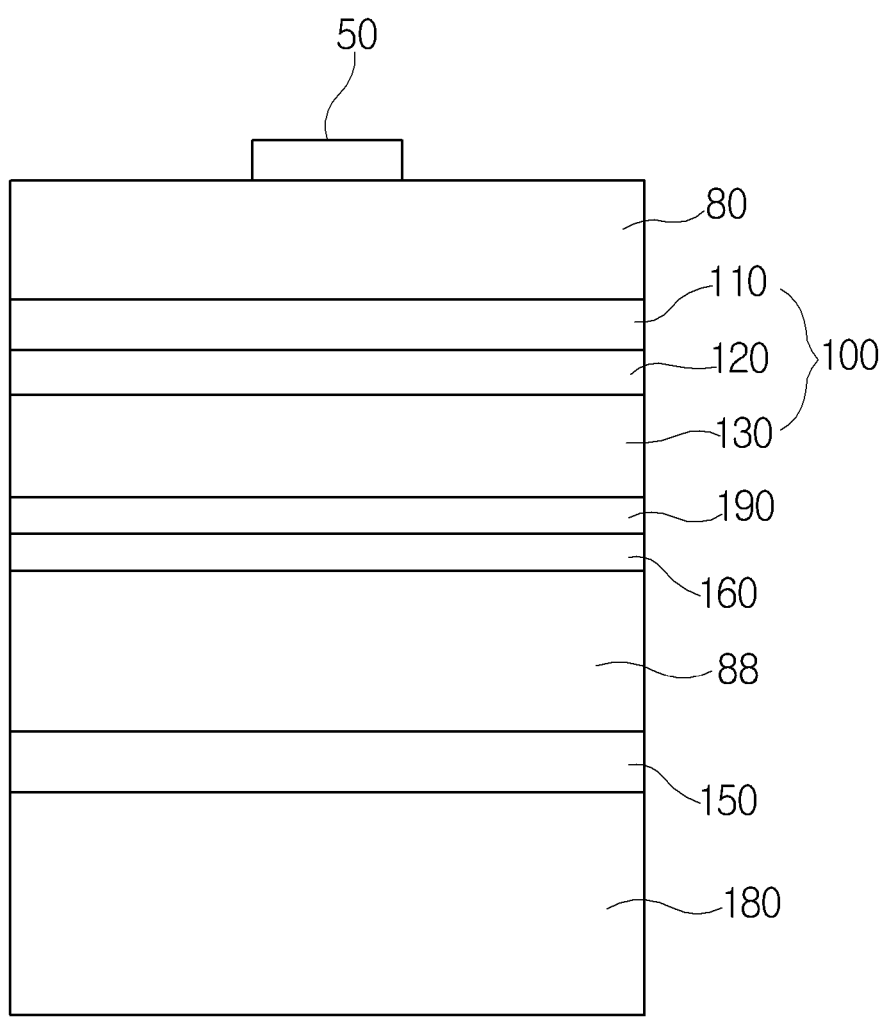
Figure 3:
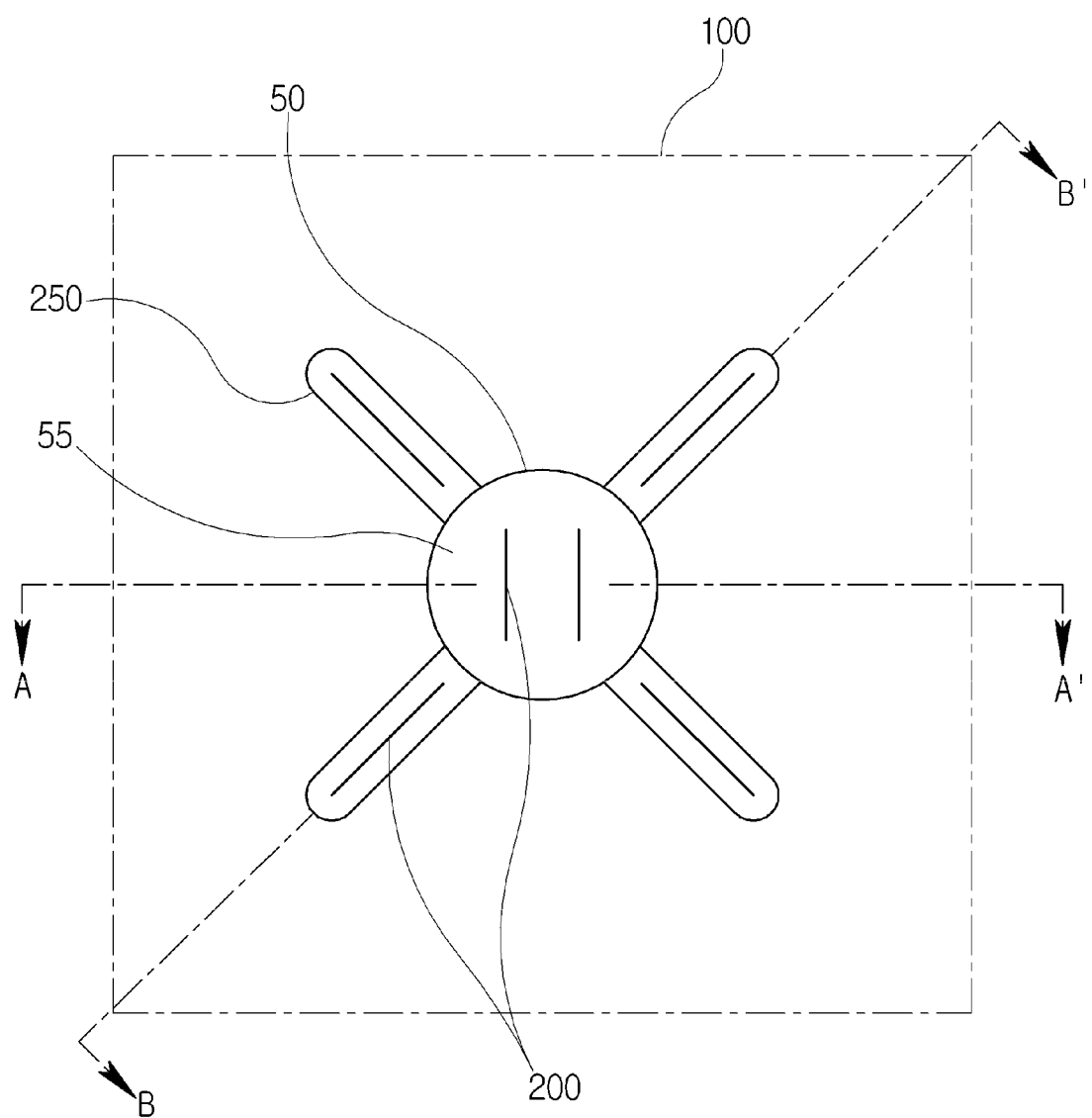
FIG. 3 is a plan view of an electrode area in accordance with an exemplary embodiment of the present invention.

FIGS. 2a and 2b are cross-sectional views of a vertical-type LED in accordance with an exemplary embodiment of the present invention, and FIG. 3 is a plan view of an electrode area in accordance with an exemplary embodiment of the present invention. In these exemplary embodiments, a first electrode in which laser grooves are formed is described as an example, but laser grooves having the same structure as that described herein may also be formed in a second electrode.

Referring to FIGS. 2a and 2b, the vertical-type LED 10 includes a semiconductor stack structure 100 in which a second semiconductor layer 130, an active layer 120, and a first semiconductor layer 110 are sequentially stacked on a substrate 180, and may further include a conductive substrate 80 and a first electrode 50 both formed on the first semiconductor layer 110, and a second electrode 150 formed between the second semiconductor layer 130 and the substrate 180. An adhesive layer 160 may be further formed between the second electrode 150 and the substrate 180. The first and the second electrodes 50 and 150 may be electrode pads formed in pad units and are hereinafter referred to as electrode pads.

First, the substrate 180 may be a growth substrate, such as a sapphire substrate, an AlN substrate, a GaN substrate, an SiC substrate, or an Si substrate, and may be a conductive substrate having good electrical conductivity.

In the vertical-type LED 10 in accordance with the present exemplary embodiment, the adhesive layer 160 may be formed between the substrate 180 and the second electrode pad 150, and a reflection layer (not shown) for reflecting light toward the substrate 180 in order to improve light-emitting efficiency may be further included. Furthermore, the second semiconductor layer 130 may be formed to contact the second electrode pad 150.

The first semiconductor layer 110, the second semiconductor layer 130, and the active layer 120 may be formed of nitride-based semiconductors. The nitride-based semiconductor may be, for example, a two-component system nitride semiconductor, such as undoped GaN or InN, a three-component system nitride semiconductor, such as AlGaN or InGaN, or a four-component system nitride semiconductor, such as InGaN. The nitride-based semiconductor may be doped with an N-type or a P-type or an undoped nitride-based semiconductor.

The conductive substrate 80 is formed on the first semiconductor layer 110. The conductive substrate 80 may be made of GaN, and impurities may be doped into the GaN in order to form the conductive substrate 80 using conductive materials. For example, the impurities may include silicon (Si), and an N-type conductive substrate may be formed by implanting Si, that is, N-type impurities, at a low concentration of $1 \times 10^{17}$ to $1 \times 10^{18}$ cm$^{-3}$. The conductive substrate 80 is not specially limited, and any substrate having N-type conductivity may be used as the conductive substrate 80.

The first electrode pad 50 may be formed on the conductive substrate 80. The first electrode pad 50 may be made of at least one of gold (Au), aluminum (Al), titanium (Ti), and an alloy thereof.

The vertical-type LED 10 having improved light-emitting efficiency can be formed by forming the electrode pads 50 and 150 so that they have a vertical structure as described above.

Referring to FIG. 2b, the structure thereof differs from the structure of FIG. 2a in the disposition of the second electrode pad 150.

A metal reflection layer 190 may be formed under the second semiconductor layer 130 of the semiconductor stack structure 100. The metal reflection layer 190 may be disposed in such a way as to reflect light emitted from the active layer 120. Furthermore, a second conductive substrate 88 is provided, and the second electrode pad 150 is formed on the second conductive substrate 88. Furthermore, the vertical-type LED 10 may be formed by forming the adhesive layer 160 on a surface opposite a surface in which the second electrode pad 150 has been formed so that the metal reflection layer 190 and the second conductive substrate 88 are bonded.

Referring to FIGS. 2a and 2b, in the vertical-type LEDs 10 in accordance with the present exemplary embodiments, grooves (not shown) may be formed in the conductive substrate 80, 88 including the electrode pad 50, 150 so that the electrode pad 50, 150 and the conductive substrate 80, 88 are subject to ohmic contact. For example, laser grooves (not shown) may be formed by performing laser scribing on the conductive substrate 80, 88 including the electrode pad 50, 150.

Heat and plasma are generated in the electrode pad 50, 150 and the conductive substrate 80, 88 during the laser scribing. The plasma is converted into heat energy. The heat energy is transferred to the electrode pad 50, 150 and the conductive substrate 80, 88, thereby stabilizing the doped Si impurities within the conductive substrate 80, 88 and controlling the work function of the interface between the electrode pad 50, 150 and the conductive substrate 80, 88. Accordingly, an ohmic characteristic, that is, ohmic contact, can be improved because a Schottky barrier is lowered.

The depth of the laser groove can be controlled using laser scribing.

Referring to FIG. 3, the electrode pad 50 is formed on the conductive substrate 80 formed on the semiconductor stack structure 100. Furthermore, the electrode pad 150 is also formed on the second semiconductor layer 130 of the semiconductor stack structure 100. An electrode formed on the conductive substrate 80 is the first electrode pad 50, and an electrode coming in contact with the second semiconductor layer 130 is defined as the second electrode pad 150. Thus, FIG. 3 shows a vertical-type LED similar to as shown in FIGS. 2a and 2b above.

The second electrode pad 150 may be formed on a surface corresponding to the second semiconductor layer 130 and the substrate. The first electrode pad 50 may be formed on the conductive substrate 80 as shown in FIG. 3.

A first electrode may include a first electrode pad 50 and extension pads 250 extended from the first electrode pad 50. The first electrode pad 50 may alternatively be formed without the extension pads 250. The first electrode pad 50 and the extension pads 250 include laser grooves 200 formed by a laser. The laser groove 200 may be formed in both the first electrode pad 50 and the extension pads 250. The laser groove 200 may alternatively be formed only in the extension pad 250 or only in the first electrode pad 50. The extension pads 250 may have any shape capable of transferring heat to the conductive substrate 80 and the first electrode pad 50.

The extension pad 250 may include the laser groove 200 formed by laser scribing. When the laser groove 200 is formed by a laser, heat can be transferred to the conductive substrate 80 and the first electrode pad 50. In other words, plasma is generated due to the laser. The plasma is converted into heat energy, and the heat energy is transferred to the conductive substrate 80 and the first electrode pad 50.

As described above, in the vertical-type LED 10, the first electrode pad 50 may be subject to ohmic contact with the conductive substrate 80 because heat is locally transferred to the conductive substrate 80 and the first electrode pad 50 using a laser.

Accordingly, an operating voltage can be lowered because the first electrode pad 50 is subject to ohmic contact with the conductive substrate 80. Furthermore, the amount of heat generated from LED operation can be reduced due to the lowered operating voltage.

Figure 4A:
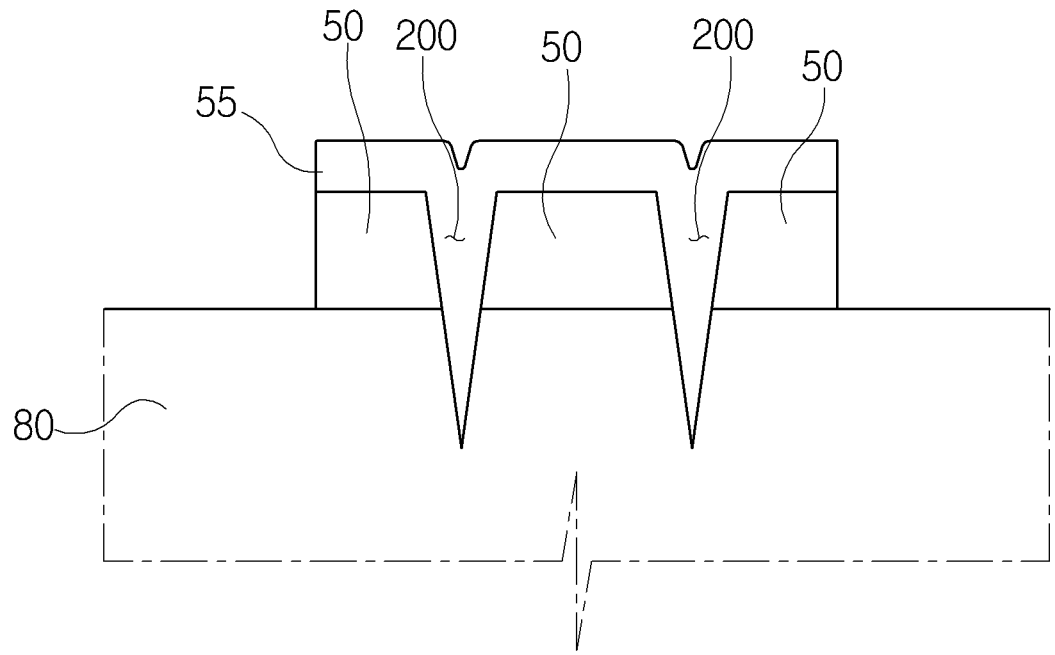
FIGS. 4a and 4b are cross-sectional views of line A-A' of FIG. 3.
Figure 4B:
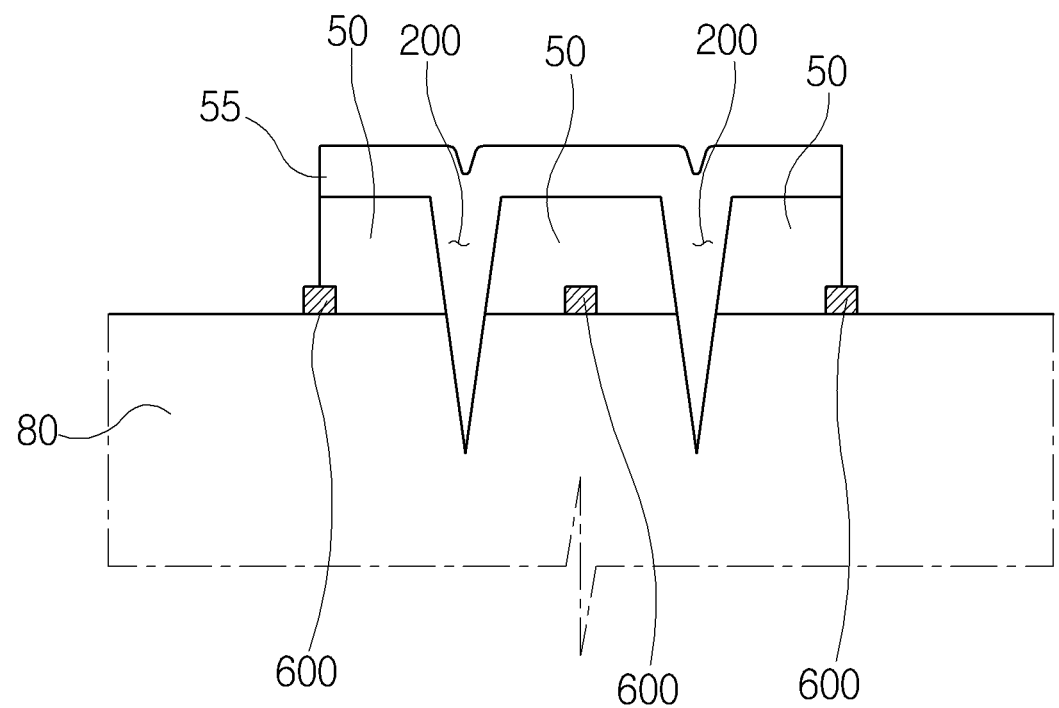
Figure 5A:
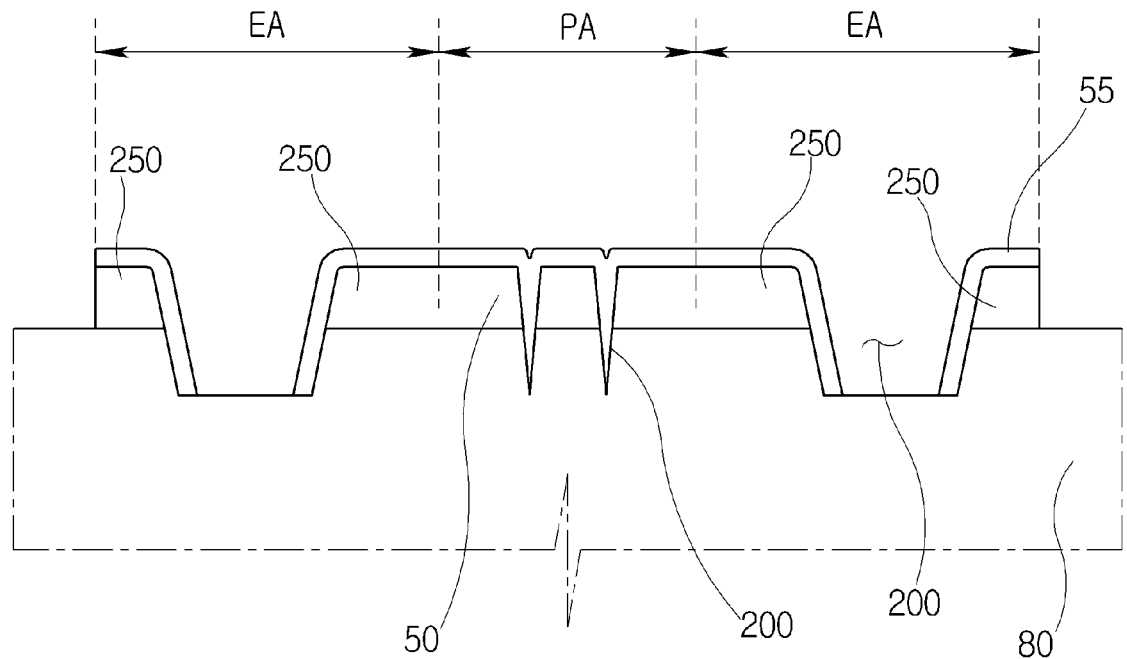
FIGS. 5a and 5b are cross-sectional views of line B-B' of FIG. 3.
Figure 5B:
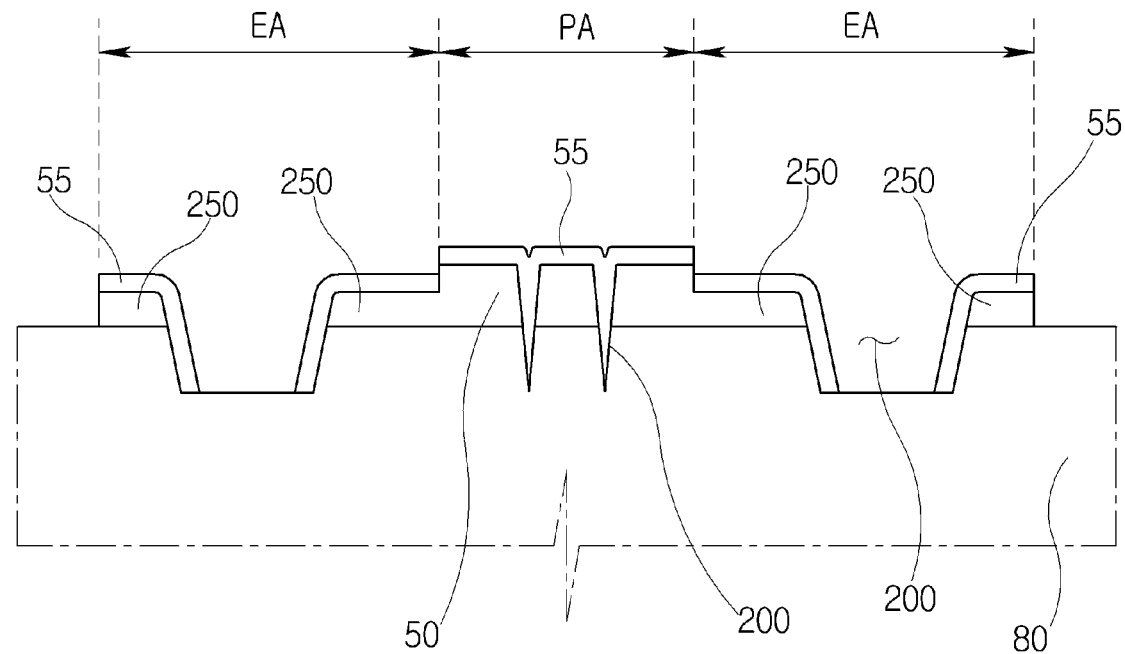

FIGS. 4a and 4b are cross-sectional views of line A-A' of FIG. 3, and FIGS. 5a and 5b are cross-sectional views of line B-B' of FIG. 3. The cross sections are described with reference to FIGS. 2a, 2b, 3, 4a, and 4b.

Referring to FIGS. 4a and 4b, the laser groove 200 is configured to penetrate the extension pad 250, the first electrode pad 50, or both, and is formed up to part of the conductive substrate 80. The cross section of the laser groove 200 may have a V-cut groove shape.

Furthermore, a plating layer 55 (comprising, for example, Au) may be further formed on the first electrode pad 50 and the extension pad 250. The groove of the V-cut groove shape, that is, the laser groove 200, may be filled with the plating layer 55.

Since the laser groove 200 is formed by laser scribing from the first electrode pad 50 to part of the conductive substrate 80, the first electrode pad 50 may be subject to ohmic contact with the conductive substrate 80 because heat energy generated by the laser is provided to the conductive substrate 80 and the first electrode pad 50. The depth of the laser groove 200 toward the inside of the conductive substrate 80 may be controlled, and the laser groove 200 may be formed in a depth of 20 μm to 30 μm.

In the prior art, in order for an electrode pad to be subject to ohmic contact with a conductive substrate, high-temperature annealing of 600° C. or higher may be required. If annealing is performed at this high temperature for ohmic contact purposes, however, the quality of the entire device may be deteriorated because the annealing may negatively influence materials formed in the semiconductor stack structure.

The conventional problem can be solved by locally transferring heat to the first electrode pad and the conductive substrate using a laser as described in exemplary embodiments of the present invention.

Furthermore, an operating voltage can be lowered if the first electrode pad 50 is subject to ohmic contact with the conductive substrate 80 as described above. Furthermore, the amount of heat generated from an LED can be reduced due to the lowered operating voltage.

Referring to FIG. 4b, a reflection layer 600 may be further interposed between the first electrode pad 50 and the conductive substrate 80. The reflection layer 600 may include a plurality of layers having different refractive indices and functions to reflect light, thus improving light extraction efficiency. Furthermore, the reflection layer 600 reflects light that is totally reflected from a light incident surface and then returned back to the semiconductor stack structure 100, thereby being capable of preventing deterioration. Furthermore, adhesive strength between the conductive substrate 80 and the first electrode pad 50 can be enhanced by the structure of the reflection layer 600. The structure of the reflection layer 600 having improved adhesive strength is described later with reference to FIGS. 8 and 9.

Referring to FIGS. 5a and 5b, the first electrode is formed in a pad area PA in which the first electrode pad 50 has been formed and an extension area EA in which the extension pad 250 has been formed.

The pad area PA is an area connected by wire bonding so that an external electrical signal can be inputted. In the pad area PA, the first electrode pad 50 comes in contact with bonding materials.

If the laser groove 200 is directly formed in the first electrode pad 50, the wire-bonded contact area may be reduced. Accordingly, a bonding area can be secured by forming the extension pad 250 in the extension area EA.

When the laser groove 200 is formed in the first electrode pad 50 and the extension pad 250 as described above, the extension pad 250 may be formed to have the same height as the first electrode pad 50 or may be formed to have a different height from the first electrode pad 50.

If the extension pad 250 and the first electrode pad 50 are formed to have the same height, the process may be facilitated because the first electrode pad 50 and the extension pad 250 can be formed at the same time. If the extension pad 250 and the first electrode pad 50 are formed to have different heights, the extension pad 250 and the first electrode pad 50 may be formed using different processes. When the extension pad 250 and the first electrode pad 50 are formed using different processes, the extension pad 250 may be made of different materials which can easily transfer heat when a laser scribing process is performed.

Furthermore, the laser groove 200 of the extension area EA seems to be wide due to its cross section as shown in FIGS. 5a and 5b. The cross section of the laser groove 200 formed in the extension pad 250 may be formed to have a V-cut groove shape like the laser groove 200 of the pad area PA.

The plating layer 55 is formed on the first electrode pad 50 and the extension pad 250. The plating layer 55 may be formed to be connected in the extension area or may be formed not to be connected in the extension area.

The first electrode pad 50 may be subject to ohmic contact with the conductive substrate 80 because heat is locally provided to the conductive substrate 80 and the first electrode pad 50 using a laser as described above.

Since the first electrode pad 50 is formed in the conductive substrate 80 in ohmic contact, an operating voltage can be lowered and the amount of heat generated from an LED can be reduced due to the lowered operating voltage.

Figure 6A:
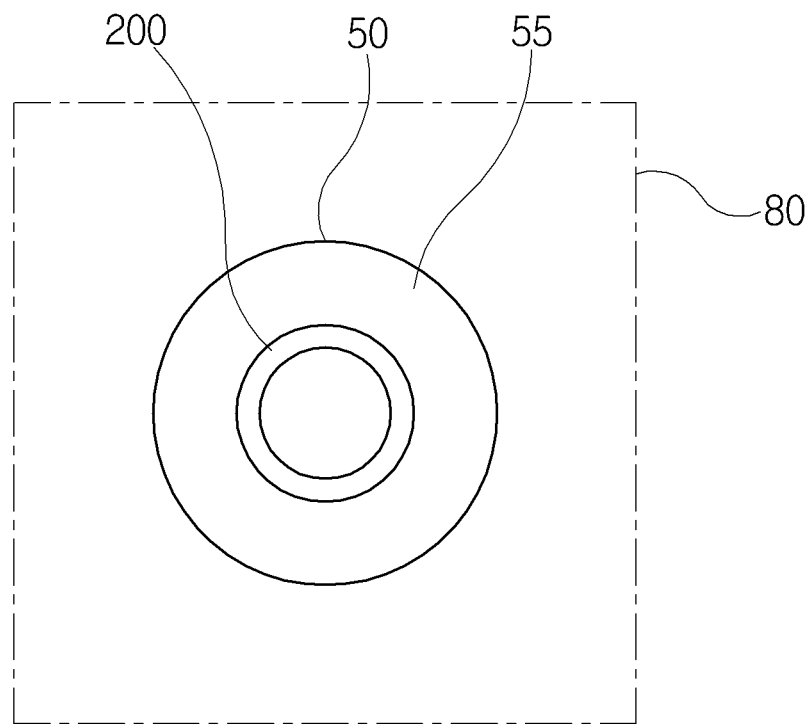
FIGS. 6a and 6b are plan views of laser grooves formed in a first electrode pad in accordance with exemplary embodiments of the present invention.
Figure 6B:
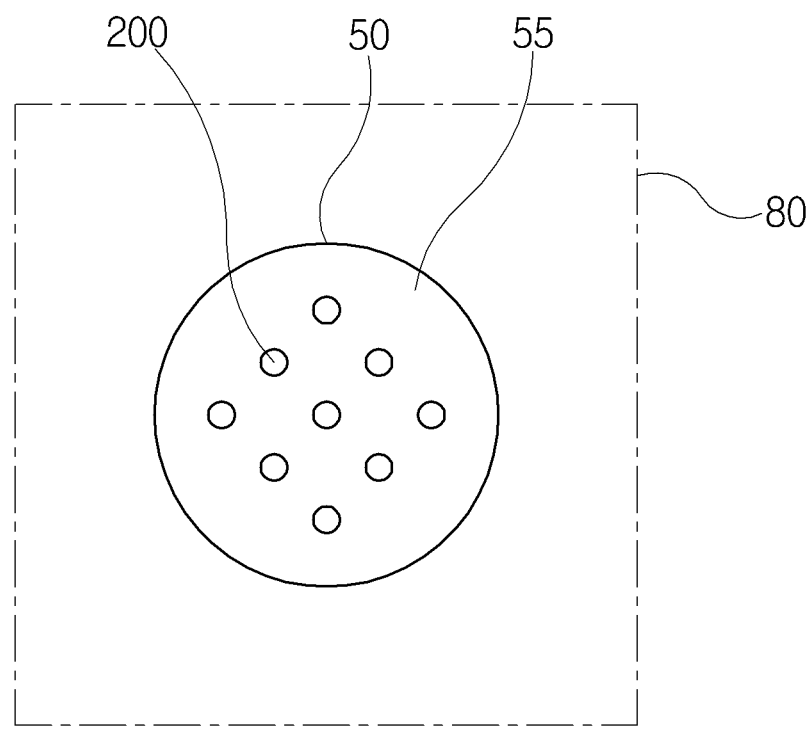
Figure 7A:
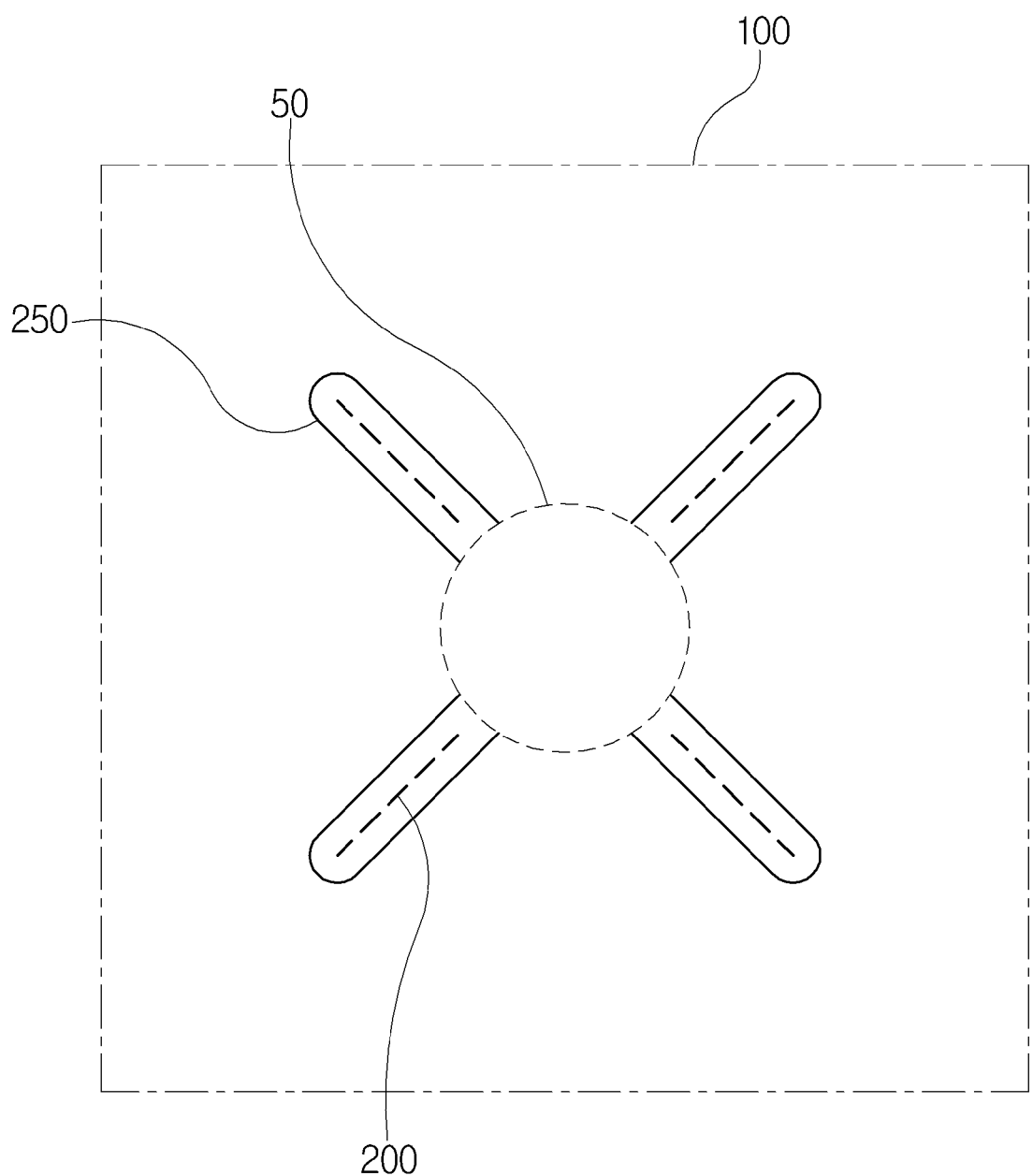
FIGS. 7a and 7b are plan views of an extension pad in accordance with exemplary embodiments of the present invention.
Figure 7B:
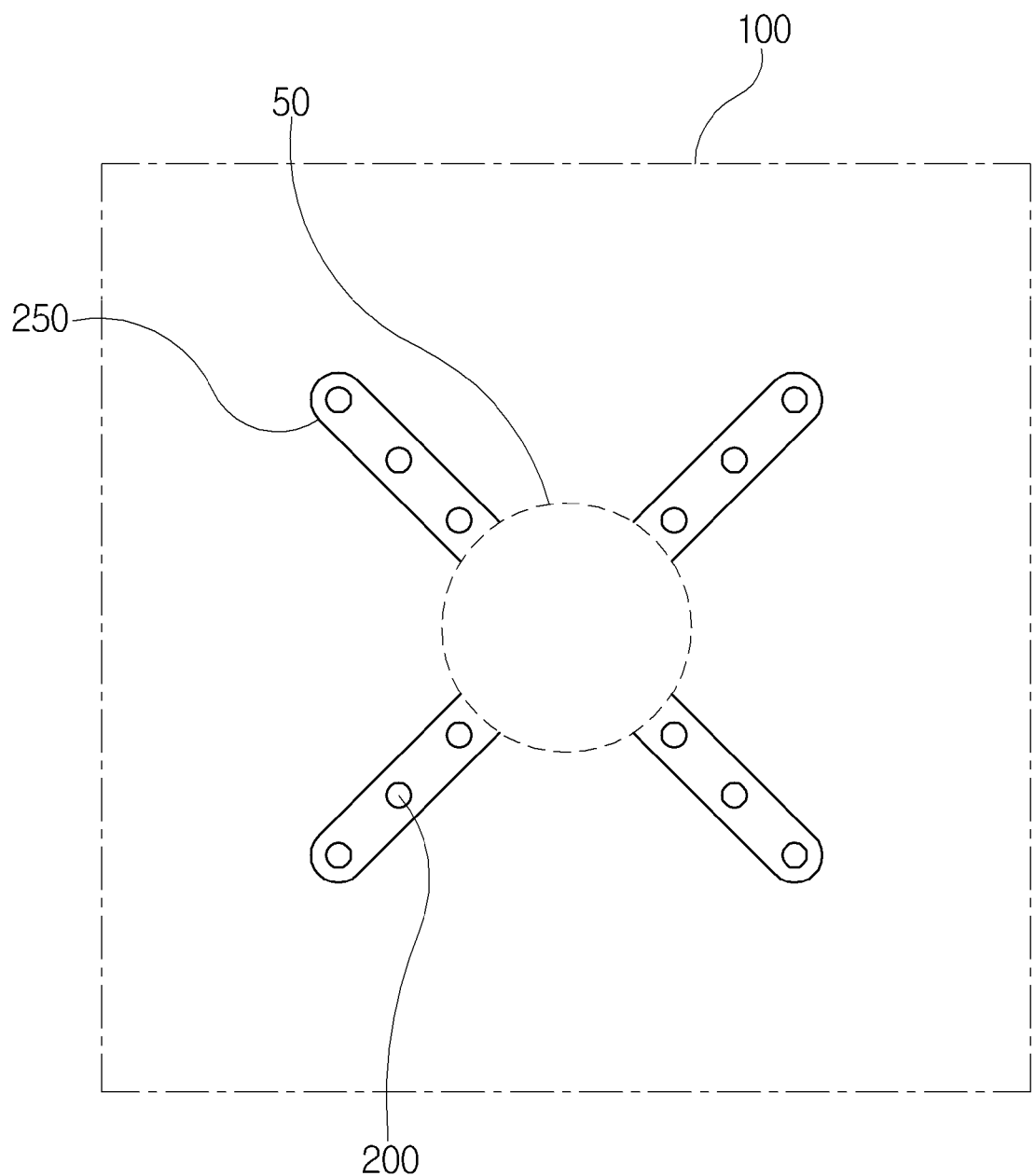

FIGS. 6a, 6b, 7a, and 7b are diagrams illustrating exemplary embodiments of laser grooves in a vertical-type LED in accordance with the present invention, FIGS. 6a and 6b are plan views of a laser groove formed in a first electrode pad, and FIGS. 7a and 7b are plan views of an extension pad. The embodiments are described with reference to FIGS. 2a, 2b, 3, 4a, 4b, 5a, and 5b in order to avoid redundancy.

Referring to FIGS. 6a and 6b, the laser grooves 200 are formed in the first electrode pad 50. The first electrode pad 50 may be subject to ohmic contact with the conductive substrate 80 by directly performing laser scribing on the first electrode pad 50.

The laser groove 200 formed by performing laser scribing penetrates part of the conductive substrate 80 in the first electrode pad 50, so heat may be transferred to the first electrode pad 50 and the conductive substrate 80. If the laser groove 200 is directly formed in the first electrode pad 50, heat generated from a laser may be directly transferred to the first electrode pad 50 and the conductive substrate 80, thereby enabling stable ohmic contact.

The laser groove 200 may be formed in the first electrode pad 50 in a ring form or may be formed to have a plurality of dot shapes disposed at specific intervals. Furthermore, the plating layer 55 that fills the V-cut groove formed in the laser groove 200 may be formed in order to secure a bonding contact area by connecting areas shorted by the V-cut groove through the plating layer 55.

If the laser groove 200 is directly formed in the first electrode pad 50 as described above, the first electrode pad 50 can be stably subject to ohmic contact with the conductive substrate 80, the depth of the laser groove 200 can be easily controlled, and the laser groove 200 can be formed in various forms. Accordingly, the process is facilitated because there is no limit to a shape according to laser scribing.

Referring to FIGS. 7a and 7b, the extension pads 250 are extended from the first electrode pad 50. The extension pad 250 may have the laser grooves 200 formed in a dot form through a laser scribing process. In another exemplary embodiment as shown in FIG. 7b, the laser grooves 200 may be disposed to have a circle at specific intervals.

An area to which the first electrode pad 50 is bonded can be secured by forming the laser grooves 200 in the extension pad 250 as described above.

Figure 8:
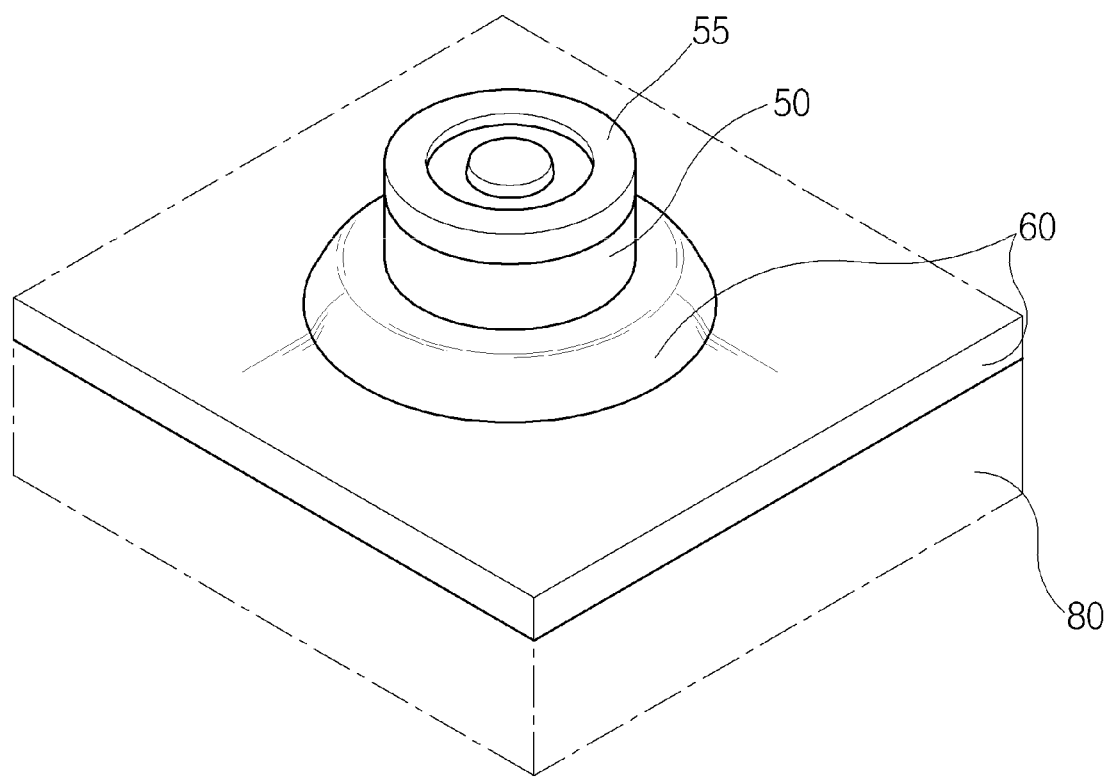
FIG. 8 is a perspective view of an electrode pad having improved adhesive strength in a vertical-type LED in accordance with an exemplary embodiment of the present invention.
Figure 9:
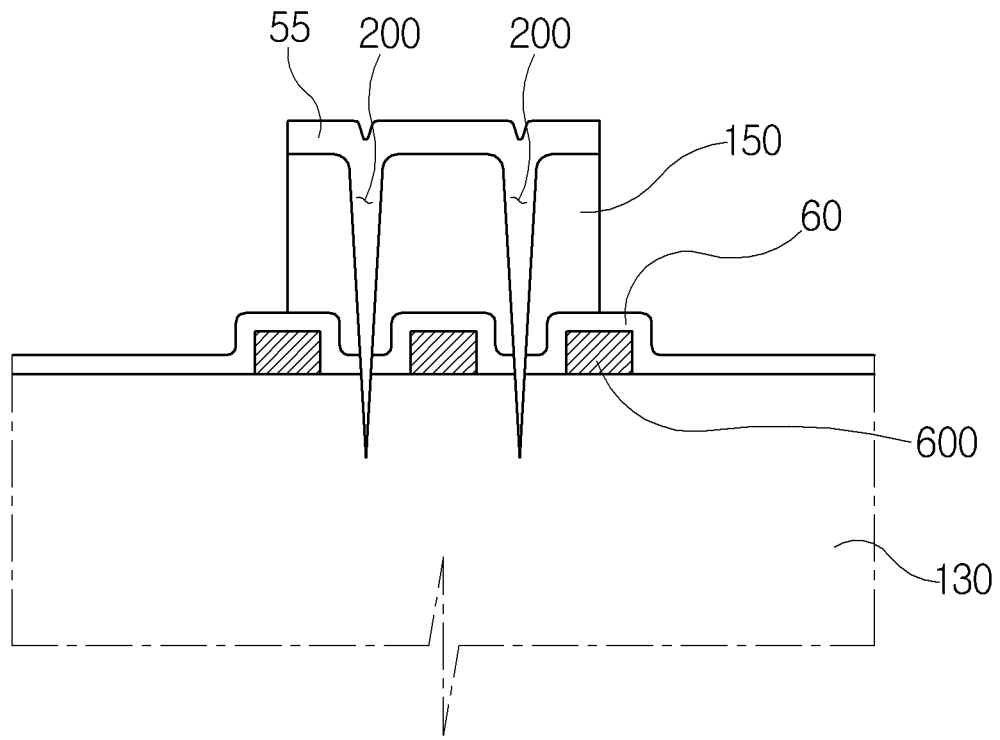
FIG. 9 is a cross-sectional view of the electrode pad having improved adhesive strength in the vertical-type LED taken along line A-A' of FIG. 8.

FIG. 8 is a perspective view of an electrode pad having improved adhesive strength, of a vertical-type LED in accordance with exemplary embodiments of the present invention, and FIG. 9 is a cross-sectional view of the electrode pad of FIG. 8. The present exemplary embodiment is described with reference to FIGS. 2a, 2b, 3, 4a, 4b, 5a, 5b, 6a, 6b, 7a, and 7b in order to avoid redundancy and also facilitate a description.

Although the first electrode pad 50 has been illustrated above, but the present invention is not limited to the first electrode pad 50 and may also be applied to the second electrode pad 150. Accordingly, the first electrode pad 50 and the second electrode pad 150 are collectively called an electrode pad 50, 150.

Furthermore, for the ohmic contact of the electrode with the laser groove 200, reference can be made to FIGS. 2a, 2b, 3, 4a, 4b, 5a, 5b, 6a, 6b, 7a, and 7b. The electrode having adhesive strength is described below.

Referring to FIGS. 8 and 9, a reflection layer 600 including a plurality of layers having different refractive indices may be formed between a conductive substrate 80 and a first electrode pad 50. In another exemplary embodiment, the reflection layer 600 may be formed between a second semiconductor layer 130 and a second electrode pad 150.

A transparent electrode layer 60 may be further formed between the conductive substrate 80 and the first electrode pad 50 or between a second semiconductor layer 130 and a second electrode pad 150. The transparent electrode layer 60 may be selectively formed on the entire surface of the conductive substrate 80 or may be formed only in some area of the conductive substrate 80. In another exemplary embodiment, the transparent electrode layer 60 may be selectively omitted. The transparent electrode layer 60 may be made of Indium-Tin-Oxide (ITO).

A laser groove 200 may be formed to penetrate the second electrode pad 150, the transparent electrode layer 60, and the second semiconductor layer 130. In another exemplary embodiment, as in FIG. 2b, the laser groove 200 may be formed to penetrate the second electrode pad 150, the transparent electrode layer 60, and the second conductive substrate 88. The laser groove 200 may be formed in an area in which the reflection layer 600 has not been formed by controlling a laser scribing area. Furthermore, a plating layer 55 that fills the laser groove 200 may be further formed.

The reflection layer 600 may be formed by alternately stacking, for example, two or more insulating layers having different refractive indices so that the reflection layer 600 performs the function of a Distributed Bragg Reflector (DBR). The DBR is used when high reflectance is necessary in various LEDs having a light-emitting function, a photo detection function, and a light modulation function.

The DBR is a reflection mirror formed by alternately stacking two types of media having different refractive indices and configured to reflect light using a difference between refractive indices. The reflection layer 600 may be made of insulating materials, such as $SiOx$, $SiNx$, $SixNy$, or $SiONx$, and may be formed using, for example, a Chemical Vapor Deposition (CVD) method or a sputtering method. Furthermore, the reflection layer 600 may be made of conductive materials, including at least one of Al, Ag, Pt, Pd, Au, Rh, an Al alloy, an Ag alloy, a Pt alloy, a Pd alloy, an Au alloy, or an Rh alloy. Light extraction efficiency of an LED can be improved by further providing the reflection layer 600 as described above.

A phenomenon in which the second electrode pad 150 is peeled off may be generated when a bonding process is performed on a bonding area that is subsequently bonded to the second electrode pad 150. That is, the area between the second electrode pad 150 and the second semiconductor layer 130 is an area whose adhesive strength is important. In another exemplary embodiment, as in FIG. 2b, the area between the second electrode pad 150 and the second conductive substrate 88 is an area whose adhesive strength is important. Furthermore, the same adhesive strength relation may be present between the first electrode pad 50 and the conductive substrate 80.

A surface of the conductive substrate 80 has roughness due to the thickness of the reflection layer 600, or the transparent electrode layer 60 formed on the reflection layer 600 has roughness. Such roughness may improve adhesive strength with materials that are formed on the surface. Furthermore, the roughness formed on the surface can improve light extraction efficiency. A surface of the conductive substrate 80 in which the roughness has been formed or a surface of the transparent electrode layer 60 in which the roughness has been formed as described above can improve adhesive strength with the electrode pads 50 and 150 formed on the conductive substrate 80 and the transparent electrode layer 60.

Furthermore, the reflection layer 600 may be formed in a ring form. The electrode pads 50 and 150 can have a structure in which the reflection layer 600 internally holds the electrode pads 50 and 150 due to the reflection layer 600 formed in a ring form. Adhesive strength between the conductive substrate 80 and the electrode pads 50 and 150 formed to have the holding structure as described above can be improved.

Furthermore, the transparent electrode layer 60 is formed in a grip form that surrounds the side of the electrode pads 50 and 150 and may be formed on the conductive substrate 80. The transparent electrode layer 60 formed around the electrode pads 50 and 150 is also formed to have a grip structure that grips the electrode pads 50 and 150 externally, thereby being capable of further improving adhesive strength.

Accordingly, adhesive strength between the transparent electrode layer 60 and the electrode pads 50 and 150 formed on the transparent electrode layer 60 can be improved. Furthermore, adhesive strength between the electrode pads 50 and 150 and the conductive substrate 80 or the second semiconductor layer 130 or both can also be improved, thereby being capable of preventing the electrode pads 50 and 150 from being peeled off or preventing a rise of an operating voltage due to partial contact failure. That is, an operating voltage can be lowered because the adhesive strength of the electrode pads 50 and 150 is improved. Furthermore, the amount of heat generated due to a contact failure can be reduced.

Figure 10:
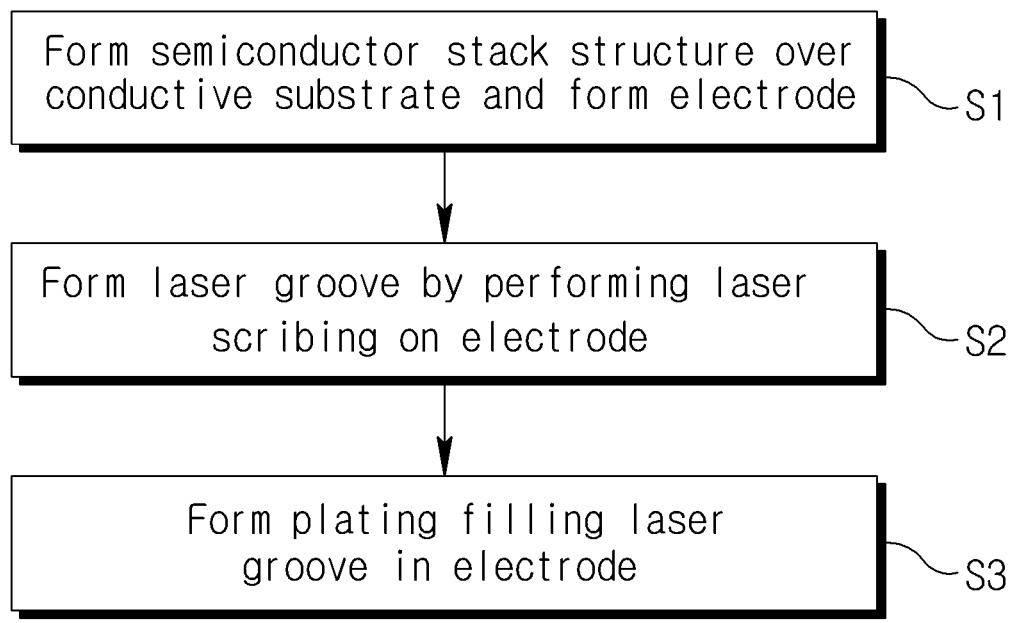
FIG. 10 is a flowchart illustrating a method of fabricating a vertical type LED in accordance with an exemplary embodiment of the present invention.

FIG. 10 is a flowchart illustrating a method of fabricating the vertical type LED in accordance with an exemplary embodiment of the present invention. For convenience of description, the method of FIG. 10 is described with reference to FIGS. 2a, 2b, 3, 4a, 4b, 5a, 5b, 6a, 6b, 7a, 7b, 8, and 9. The vertical-type LED of FIG. 2a is referenced in particular an example.

First, in order to form the vertical-type LED 10, the semiconductor stack structure 100 in which the first semiconductor layer 110, the active layer 120, and the second semiconductor layer 130 are sequentially formed over the conductive substrate 80 is formed at step S1. Furthermore, the electrodes 50 and 150 are formed on the semiconductor stack structure 100. The electrodes 50 and 150 form the first electrode pad 50 and the second electrode pad 150. The first electrode pad 50 may be formed on the conductive substrate 80, and the second electrode pad 150 may be formed on the second semiconductor layer 130. The first electrode pad 50 may be formed on a surface that is opposite to a surface in which the semiconductor stack structure 100 has been formed.

A process of attaching the substrate 180 to the second electrode pad 150 is further performed. The adhesive layer 160 may be further formed in order to bond the substrate 180 and the second electrode pad 150. A reflection member layer (see 190 of FIG. 2b), such as a metal reflection layer, may be further formed between the adhesive layer 160 and the second electrode pad 150.

The reflection layer 600 may be further formed prior to the formation of the first electrode pad 50. The reflection layer 600 may be formed in the pad area PA in a ring form, and the first electrode pad 50 may be formed on the reflection layer 600, with the result that the reflection layer 600 is formed to hold the first electrode pad 50. Accordingly, adhesive strength between the first electrode pad 50 and the conductive substrate 80 may be improved.

At step S2, the laser grooves 200 are formed in the first electrode pad 50 by performing laser scribing on the first electrode pad 50. The laser groove 200 is formed to penetrate from the first electrode pad 50 up to part of a surface of the conductive substrate 80. The second electrode pad may also be subject to ohmic contact by performing laser scribing on the second electrode pad. The second electrode pad is formed by laser scribing before the substrate is attached to the second electrode pad by bonding.

Heat can be transferred to the first electrode pad 50 and the conductive substrate 80 because laser scribing is performed on the first electrode pad 50 and part of the conductive substrate 80 as described above. The transferred heat enables the first electrode pad 50 to be subject to ohmic contact with the conductive substrate 80.

At step S3, the plating layer 55 is formed on the first electrode pad 50 including the laser grooves 200. The plating layer 55 may be made of gold (Au). The plating layer 55 may be formed using an electrolysis method or an electroless method.

In the prior art, the first electrode pad is formed before the semiconductor stack structure is formed on the conductive substrate. An ohmic contact process is performed in a temperature of 600° C. or higher so that the conductive substrate is subject to ohmic contact with the first electrode pad. An adverse effect may be exerted on materials for the semiconductor stack structure and thus the quality of a device may be deteriorated if the process is performed in a temperature of 600° C. or higher, however.

According to exemplary embodiments of the present invention, the ohmic contact process may be facilitated because laser scribing is performed on an electrode pad after forming the electrode pad.

In accordance with the exemplary embodiments of the present invention, the method of fabricating a vertical-type LED may prevent thermal damage to a semiconductor layer because an annealing process is not performed and an ohmic contact process, that is, a laser scribing process, is performed on the electrode after formation thereof.

In accordance with an LED of the present invention, an electrode therein may be subject to ohmic contact because heat can be locally transferred using a laser. Accordingly, an operating voltage of the LED can be lowered and the amount of heat generated therein can be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A Light-Emitting Diode (LED), comprising:
   a semiconductor stack structure comprising a first semiconductor layer, an active layer, and a second semiconductor layer, the semiconductor stack structure being disposed on a substrate;
   a GaN substrate disposed on the semiconductor stack structure; and
   an electrode disposed on and in ohmic contact with the GaN substrate,
   wherein the electrode comprises grooves penetrating the electrode and a portion of the GaN substrate, and
   wherein the electrode comprises:
      an electrode pad; and
      extension pads extended from the electrode pad.

2. The LED of claim 1, wherein the grooves are formed in the electrode pad and the extension pads.

3. The LED of claim 1, wherein the grooves are formed in the extension pads.

4. The LED of claim 1, wherein the grooves comprise a plurality of parallel groove shapes formed in the electrode pad.

5. The LED of claim 1, wherein the grooves are formed in the electrode pad in a ring form.

6. The LED of claim 1, wherein the grooves are formed in the electrode pad in a dot form disposed at regular intervals.

7. The LED of claim 1, wherein the grooves are formed in the extension pad in a discontinuous dotted line form.

8. The LED of claim 1, wherein the grooves are formed in the extension pads in a plurality of circles.

9. The LED of claim 1, further comprising a plating layer disposed on the electrode pad and disposed in the grooves.

10. The LED of claim 1, wherein the GaN substrate comprises a nitride doped with impurities.

11. The LED of claim 1, wherein each groove of the grooves comprises a cross-section having a V-cut shape.

12. The LED of claim 1, further comprising a reflection layer disposed between the electrode pad and the GaN substrate.

13. The LED of claim 12, wherein the reflection layer comprises a plurality of layers having different refractive indices.

14. The LED of claim 12, wherein the reflection layer is disposed in a ring pattern, a surface of the reflection layer comprises a rough portion, and the electrode pad is connected to the GaN substrate via the reflection layer.

15. The LED of claim 1, further comprising:
a reflection layer disposed between the electrode pad and the second semiconductor layer, the reflection layer comprising a plurality of layers having different refractive indices; and
a transparent electrode layer disposed on the second semiconductor layer.

16. The LED of claim 15, wherein the transparent electrode layer is disposed on the reflection layer and disposed between the electrode pad and the second semiconductor layer.

17. The LED of claim 15, wherein the transparent electrode layer is disposed between the electrode pad and the second semiconductor layer, other than at a portion of the second semiconductor layer on which the reflection layer is disposed.

18. The LED of claim 1, wherein the electrode pad comprises an N-type electrode pad or a P-type electrode pad.

19. A method of fabricating a light-emitting diode (LED), the method comprising:
forming a semiconductor stack structure by sequentially forming a first semiconductor layer, an active layer, and a second semiconductor layer on a GaN substrate;
forming an electrode on the semiconductor stack structure;
performing laser scribing on the electrode to form grooves penetrating the electrode to a portion of the GaN substrate; and
forming a plating layer on the electrode and in the grooves,
wherein the electrode comprises:
an electrode pad; and
extension pads extending from the electrode pad.

20. The method of claim 19, wherein the laser scribing transfers heat for ohmic contact between the electrode and the GaN substrate.

21. The method of claim 19, wherein the GaN substrate is attached to the electrode pad before forming the grooves.

22. The method of claim 19, further comprising forming a reflection layer on the GaN substrate, before forming the plating layer on the electrode.

23. The method of claim 19, wherein the grooves are formed in the electrode pad and the extension pads.

24. The method of claim 19, wherein the grooves are formed in the extension pads.

25. The method of claim 19, wherein the grooves comprise a plurality of parallel groove shapes formed in the electrode pad.

26. The method of claim 19, wherein the grooves are formed in the electrode pad in a ring form.

27. The method of claim 19, wherein the grooves are formed in the electrode pad in a dot form disposed at regular intervals.

28. The method of claim 19, wherein the grooves are formed in the extension pad in a discontinuous dotted line form.

29. The method of claim 19, wherein the grooves are formed in the extension pad in a plurality of circles.

30. The method of claim 19, wherein the electrode pad comprises an N-type electrode pad or a P-type electrode pad.

* * * * *